United States Patent
Abdo et al.

(10) Patent No.: US 10,903,541 B2
(45) Date of Patent: Jan. 26, 2021

(54) PACKAGING AND THERMALIZATION OF CRYOGENIC DISPERSIVE RESISTIVE HYBRID ATTENUATORS FOR QUANTUM MICROWAVE CIRCUITS

(71) Applicant: International Business Machines Corporation, Armonk, NY (US)

(72) Inventors: Baleegh Abdo, Fishkill, NY (US); Patryk Gumann, Tarrytown, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/787,846

(22) Filed: Feb. 11, 2020

(65) Prior Publication Data
US 2020/0176844 A1 Jun. 4, 2020

Related U.S. Application Data

(62) Division of application No. 16/114,890, filed on Aug. 28, 2018.

(51) Int. Cl.
| | |
|---|---|
| H01P 1/22 | (2006.01) |
| H03H 7/12 | (2006.01) |
| H01P 5/12 | (2006.01) |
| G06N 10/00 | (2019.01) |
| H03H 11/24 | (2006.01) |

(52) U.S. Cl.
CPC ............ *H01P 1/22* (2013.01); *G06N 10/00* (2019.01); *H01P 5/12* (2013.01); *H03H 7/12* (2013.01); *H03H 11/24* (2013.01)

(58) Field of Classification Search
CPC .......... H01P 1/22; H01P 1/227; H03H 11/24; H03H 7/24

USPC .............................................. 333/81 A, 81 R
See application file for complete search history.

(56) References Cited

U.S. PATENT DOCUMENTS 7,852,171 B2 * 12/2010 Das ...................... H01P 1/2039
333/81 A

OTHER PUBLICATIONS

Yeh et al., "Microwave attenuators for use with quantum devices below 100 mK", Journal of Applied Physics, American Institute of Physics, US, Jun. 8, 2017, vol. 121, No. 22, http://dx.doi.Org/10.1063/1.4984894.*
List of all IBM related dockets, 2020.

* cited by examiner

Primary Examiner — Stephen E. Jones
(74) Attorney, Agent, or Firm — Garg Law Firm, PLLC; Rakesh Garg; Keivan Razavi (57) ABSTRACT

A hybrid microwave attenuator is constructed by forming a circuit and a housing. The circuit has two ports, a resistive component configured to attenuate some frequencies in an input signal (transmitted signal), and a dispersive component configured to attenuate some frequencies within a frequency range. The resistive component and the dispersive component are arranged in a series configuration relative to one another between the two ports of the circuit. The housing includes a closable structure in which the circuit is positioned, the structure being formed of a material that exhibits at least a threshold level of thermal conductivity, where the threshold level of thermal conductivity is achieved at a cryogenic temperature range in which a quantum computing circuit operates. The housing further includes a pair of microwave connectors, the pair of connectors being thermally coupled to the housing.

19 Claims, 9 Drawing Sheets

FIGURE 1

FIGURE 2 (PRIOR-ART)

PACKAGING AND THERMALIZATION OF CRYOGENIC DISPERSIVE RESISTIVE HYBRID ATTENUATORS FOR QUANTUM MICROWAVE CIRCUITS

TECHNICAL FIELD

The present invention relates generally to a device, a housing design method, and a construction system for a microwave frequency attenuator housing usable with superconducting qubits in quantum computing. More particularly, the present invention relates to a device, method, and system for packaging and thermalization of cryogenic dispersive-resistive hybrid attenuators for quantum microwave circuits.

BACKGROUND

Hereinafter, a "Q" prefix in a word of phrase is indicative of a reference of that word or phrase in a quantum computing context unless expressly distinguished where used.

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits") to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines corporation in the United States and in other countries.)

A superconducting qubit includes a Josephson junction. A Josephson junction is formed by separating two thin-film superconducting metal layers by a non-superconducting material. When the metal in the superconducting layers is caused to become superconducting—e.g. by reducing the temperature of the metal to a specified cryogenic temperature—pairs of electrons can tunnel from one superconducting layer through the non-superconducting layer to the other superconducting layer. In a qubit, the Josephson junction—which functions as a dispersive nonlinear inductor—is electrically coupled in parallel with one or more capacitive devices forming a nonlinear microwave oscillator. The oscillator has a resonance/transition frequency determined by the value of the inductance and the capacitance in the qubit circuit. Any reference to the term "qubit" is a reference to a superconducting qubit circuitry that employs a Josephson junction, unless expressly distinguished where used.

The information processed by qubits is carried or transmitted in the form of microwave signals/photons in the range of microwave frequencies. The microwave signals are captured, processed, and analyzed to decipher the quantum information encoded therein. A readout circuit is a circuit coupled with the qubit to capture, read, and measure the quantum state of the qubit. An output of the readout circuit is information usable by a q-processor to perform computations.

A superconducting qubit has two quantum states—|0> and |1>. These two states may be two energy states of atoms, for example, the ground (|g>) and first excited state (|e>) of a superconducting artificial atom (superconducting qubit). Other examples include spin-up and spin-down of the nuclear or electronic spins, two positions of a crystalline defect, and two states of a quantum dot. Since the system is of a quantum nature, any combination of the two states are allowed and valid.

For quantum computing using qubits to be reliable, quantum circuits (q-circuits), e.g., the qubits themselves, the readout circuitry associated with the qubits, and other parts of the quantum processor, must not alter the energy states of the qubit, such as by injecting or dissipating energy in any significant manner, or influence the relative phase between the |0> and |1> states of the qubit. This operational constraint on any circuit that operates with quantum information necessitates special considerations in fabricating semiconductor and superconducting structures that are used in such circuits.

The presently available superconducting quantum circuits are formed using materials that become superconducting at cryogenically low temperatures, e.g., at about 10-100 millikelvin (mK), or about 4 K. The electronic circuits that are used to control, operate, and measure the quantum circuits are usually located outside the dilution fridge that houses the superconducting quantum circuit. The temperature outside the fridge is usually about 300 K (room temperature).

The presently available superconducting quantum circuits usually operate in the microwave frequency range. Microwave signals/pulses are used to initialize, manipulate, control, and measure the superconducting qubits within the superconducting q-circuits. To communicate these microwave signals between the external electronic circuits outside the fridge and the superconducting quantum circuits inside the fridge, microwave transmission lines are used inside the dilution fridge. Coaxial lines are one example of transmission lines that can carry these microwave signals.

The presently available dilution fridges are cryogenic apparatus which can be used to cool down samples/devices to millikelvin temperatures. However, the transition from room temperature to millikelvin temperatures inside the fridge is not sudden or abrupt. To facilitate the temperature transition and the cooling operation, the dilution fridge consists of multiple thermally-isolated stages (compactly referred to herein as "stage", plural "stages") held at different ambient temperatures. For example, common commercial dilution fridges have 5 temperature-stages inside the fridge 40 K, 4 K, 0.7 K, 0.1 K, 0.01 K (also known as the base stage). To simplify the discussion, we focus below on the input lines inside the fridge. To maintain the temperature difference between the different stages inside the fridge and to protect the quantum circuits from noise coming down the input lines, which originates from room-temperature electronics or blackbody radiation of higher stages or other sources of electromagnetic noise, it is common practice to use lossy transmission lines to connect between two consecutive stages and to incorporate resistive attenuators and filters in the path of these lines at the different stages. In general, components serve multiple purposes: they attenuate/reduce the noise coming down these input lines, they attenuate/reduce microwave signals propagating in the lines, they provide thermal isolation between the stages, they cool down the microwave signals propagating through them.

A signal propagating on a line passing through a stage can contain noise, especially electromagnetic noise. This noise can be in the microwave frequency spectrum or infrared spectrum. For the reasons described herein, electronic, microwave and infrared noise are undesirable when the lines and signals relate to quantum computing using q-circuits.

Attenuation of a signal is the process of reducing the power of the signal at a particular frequency or frequency-range. An attenuator is an electronic circuit with two ports that is configured to attenuate an input signal/noise at a particular frequency or frequency-range.

A resistive attenuator attenuates a transmitted signal and/or noise by dissipating the energy of the signal and/or noise in a resistive component of the attenuator. A dispersive attenuator attenuates the transmitted signal/noise through its two ports by reflecting a portion of its energy/power off the port it entered through.

The illustrative embodiments recognize that commercially available standard microwave attenuators are either resistive or dispersive but not both. Furthermore, the illustrative embodiments recognize certain disadvantages with the presently available resistive microwave attenuators. For example, in most cases, the presently available resistive attenuators are formed such that a metallic case enclosing the substrate is stainless steel, which has poor thermal conductance. Additionally, the pins of the connectors located on either port of the resistive attenuator are mechanically pressed against the conductor on the substrate, which yields a bad thermal contact. The substrate is mechanically pushed against the body of the metallic case, which also yields a bad thermal contact. In addition, the substrate materials used for these attenuators have far from ideal thermal conductance.

The illustrative embodiments further recognize that disadvantageously, the lower the attenuation in a presently available resistive attenuator, the higher the thermal and electrical resistance between the center conductor of the attenuator and a corresponding external conductor of the attenuator (e.g., ground), formed by the metallic case of the attenuator. The illustrative embodiments recognize that presently, the presently available resistive attenuator provide a fixed attenuation across a wide band of frequencies and its attenuation level cannot be made to be frequency dependent (i.e., the attenuation level is fixed versus frequency). Furthermore, the presently available resistive attenuators dissipate the microwave power in the attenuator itself. Such absorptive attenuation can have several undesired results: (1) it could raise the temperature of the attenuator, especially if the attenuator is poorly thermalized to the stage, leading to reduced cooling of the microwave signals passing through it. (2) it could raise the temperature of the stage especially if it has many attenuators and limited cooling power. (3) it could generate elevated blackbody radiation towards the lower-temperature stages.

The illustrative embodiments recognize certain disadvantages with the presently available dispersive type of commercial microwave attenuators as well. They suffer from similar thermalization issues as resistive attenuators outlined above. In addition, they can cause multiple reflections of signals in the line, which, in turn, can cause distortions in the microwave pulses/signals, crosstalk, and ripples in the measured signals.

The illustrative embodiments recognize that for an attenuator to be effective and usable in cryogenic environments, and particularly with quantum computing apparatus, the attenuator has to be shielded from microwave interference. Microwave interference can come from a variety of sources; however, the illustrative embodiments recognize that poorly formed housing of attenuators can result in significant microwave interference with the signal being propagated through the attenuator. For example, a connection in the line is a contributor to microwave interference by causing signal reflections to occur in the line that connects through the connection. The higher the number of connections, the higher the number of the reflection points and other disturbances introduced by the connections.

The illustrative embodiments recognize that the microwave shielding should be done in conjunction with robust thermalization so that temperature differentials are minimized between the attenuator and the corresponding refrigeration stage. Thermalization of one structure to another structure is the process of constructing and coupling the two structures in such a way that the coupling achieves at least a threshold level of thermal conductivity between the two structures. Good thermalization, i.e., thermalization where the thermal conductivity between the thermally coupled structure exceeds the threshold level of required thermal conductivity.

The illustrative embodiments recognize that presently available cryogenic attenuators, while suitable to operate at cryogenic temperatures up to approximately 77 degrees Kelvin (K), are unsuitable for use with quantum computing circuits, which operate in temperature less than 1 degree Kelvin, down to 2 milli K. In the temperature ranges where quantum computing circuits operate, the presently available cryogenic attenuators exhibit poor thermal conductivity of the substrate, housing and microwave connectors. Furthermore, the presently available cryogenic attenuators employ microwave connectors of different genders, which produces a need for gender conversion adapters. The adapters in turn cause an increase in the number of reflection points in the microwave lines and add additional thermal mass which needs to be cooled down to milli K.

The illustrative embodiments recognize that in order to use an attenuator for control lines of a quantum processor, the attenuator should be embedded in specially designed housing which is thermally anchored to various parts of a dilution refrigerator stage. This thermal anchoring in presently available cryogenic attenuators is still unable to achieve a desirable level of thermalization even with the increased cost and labor involved in the anchoring. A need exists for a packaging and thermalization of cryogenic dispersive-resistive hybrid attenuators for quantum microwave circuits which provides a desirable level of thermalization at temperatures where quantum processors presently operate, while providing improved microwave hygiene through minimized reflections in microwave lines.

SUMMARY

The illustrative embodiments provide an electronic attenuating device. In one embodiment, the hybrid microwave attenuator includes a circuit having two ports, the circuit comprising a resistive component configured to attenuate a plurality of frequencies in an input signal (transmitted signal), and a dispersive component configured to attenuate a second plurality of frequencies within a frequency range, wherein the resistive component and the dispersive component are arranged in a series configuration relative to one another between the two ports of the circuit. The attenuator of the embodiment further includes a housing, the housing comprising a closable structure in which the circuit is positioned, the structure being formed of a material that exhibits at least a threshold level of thermal conductivity, wherein the threshold level of thermal conductivity is achieved at a cryogenic temperature range in which a quantum computing circuit operates, and a pair of microwave connectors, the pair of connectors physically and thermally coupled to the housing.

In another embodiment, the hybrid microwave attenuator is configured to operate in a temperature range of a refrigeration stage, wherein the dispersive component further includes an inductive element formed of a material that exhibits a thermal absorption of less than a threshold thermal energy absorption when operating in the temperature range, and an electrical conductivity of greater than a threshold electrical conductivity required when operating in the temperature range.

In another embodiment, the temperature range is bound by 300 degrees Kelvin (K) and 2 K.

In another embodiment, the temperature range is bound by 2 K and 0.000001 K.

In another embodiment, the hybrid microwave attenuator is configured to operate in a temperature range of a refrigeration stage, wherein the dispersive component further includes a capacitive element comprising a dielectric of a material that exhibits a thermal absorption of less than a threshold thermal energy absorption when operating in the temperature range, and a pair of plates having an electrical conductivity of greater than a threshold electrical conductivity when operating in the temperature range.

In another embodiment, the hybrid microwave attenuator is configured to operate in a temperature range of a refrigeration stage, wherein the dispersive component further includes a substrate formed of a material that exhibits a thermal conductivity of greater than a threshold thermal conductivity when operating in the temperature range.

In another embodiment, each connector in the pair of connectors is of an identical gender.

In another embodiment, each connector in the pair of connectors coupled to a port from the two ports of the circuit.

In another embodiment, the hybrid microwave attenuator is configured to operate in a temperature range of a refrigeration stage, wherein the pair of connectors is formed of a material that exhibits a thermal conductivity of greater than a threshold thermal conductivity required when operating in the temperature range.

In another embodiment, the hybrid microwave attenuator is configured to operate in a temperature range of a refrigeration stage, wherein the closable structure is formed of a material that exhibits a thermal conductivity of greater than a threshold thermal conductivity required when operating in the temperature range.

An embodiment includes a fabrication method for fabricating the low-noise well-thermalized hybrid microwave attenuator.

An embodiment includes a system for fabricating the low-low-noise well-thermalized hybrid microwave attenuator.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Quantum computing involves reliably reading microwave emissions of the order of a single photon. A low microwave noise environment limits microwave noise to such a threshold level so as to allow reliable reading of microwave emissions of the order of a single photon. The illustrative embodiments used to describe the invention generally address and solve the above-described needs for low microwave noise and well thermalized packaging or housing for attenuating certain microwave signals mainly in the input lines connecting to q-circuits. The illustrative embodiments provide such packaging and thermalization of cryogenic dispersive-resistive hybrid attenuators for quantum microwave circuits, which address the above-described need or problem.

The illustrative embodiments recognize that performance of any superconducting based quantum architecture is heavily depended on the quality of the superconducting qubits themselves which can be directly characterized by the measuring coherence times. These times strongly depend on the performance of microwave hardware—not only the qubits themselves but also the attenuators used in the microwave lines and the housing for the attenuators—at temperature range where quantum computing circuits operate. In order to increase the coherence times, thus improve the functionality of the quantum processors, all the microwave components, control lines, components, and packaging are designed for microwave noise minimization and thermalized to a quantum computing-acceptable level of thermalization.

The illustrative embodiments allow for better and faster thermalization of the microwave components and cleaner microwave signal throughput, by utilizing an attenuator design, packaging design, fabrication materials for the attenuator, and high thermal conductivity materials in the fabrication of the packaging, as described herein.

Several embodiments describing various designs of the proposed hybrid attenuator are presented with respect to several figures first. Thereafter, several embodiments describing a low noise well thermalized packaging for a hybrid attenuator of an embodiment are presented.

An operation described herein as occurring with respect to a frequency of frequencies should be interpreted as occurring with respect to a signal of that frequency or frequencies. All references to a "signal" are references to a microwave signal unless expressly distinguished where used.

An embodiment provides a configuration of a hybrid microwave attenuator that exhibits both resistive characteristics as well as dispersive characteristics (interchangeably referred to herein as a "hybrid attenuator"). Another embodiment provides a design/construction method for the hybrid attenuator, such that the method can be implemented as a software application. The application implementing a design/construction method embodiment can be configured to operate in conjunction with an existing circuit manufacturing system—such as a circuit assembly system.

For the clarity of the description, and without implying any limitation thereto, the illustrative embodiments are described using some example configurations. From this disclosure, those of ordinary skill in the art will be able to conceive many alterations, adaptations, and modifications of a described configuration for achieving a described purpose, and the same are contemplated within the scope of the illustrative embodiments.

Furthermore, simplified diagrams of the example resistors, inductors, capacitors, and other circuit components are used in the figures and the illustrative embodiments. In an actual circuit, additional structures or component that are not shown or described herein, or structures or components different from those shown but for a similar function as described herein may be present without departing the scope of the illustrative embodiments.

Furthermore, the illustrative embodiments are described with respect to specific actual or hypothetical components only as examples. The steps described by the various illustrative embodiments can be adapted for fabricating a circuit using a variety of components that can be purposed or repurposed to provide a described function within a hybrid attenuator, and such adaptations are contemplated within the scope of the illustrative embodiments.

The illustrative embodiments are described with respect to certain types of materials, electrical properties, steps, numerosity, frequencies, circuits, components, and applications only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 1:
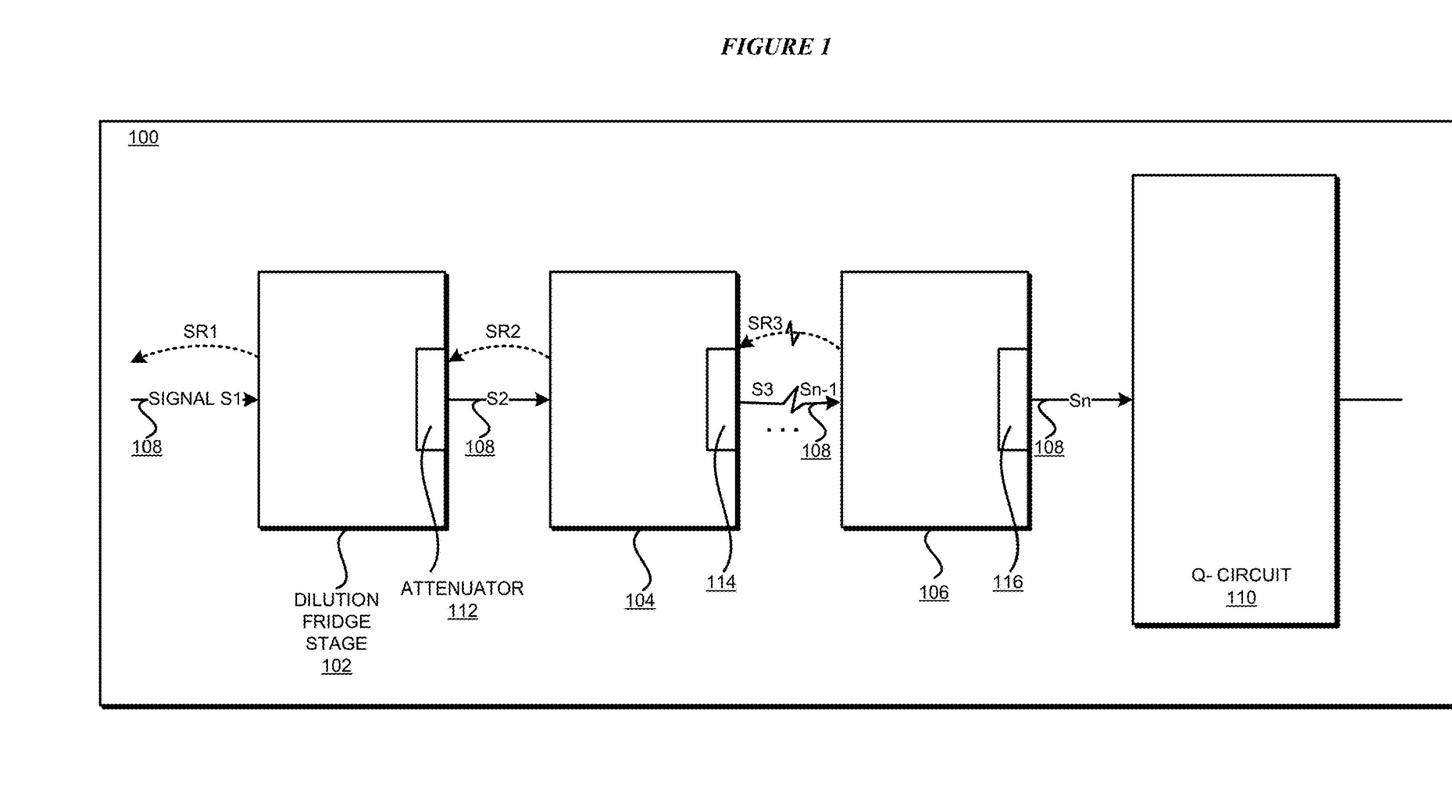
FIG. 1 depicts a block diagram of an example configuration of an input line conditioning for quantum computing devices in accordance with an illustrative embodiment.

With reference to FIG. 1, this figure depicts a block diagram of an example configuration of an input line conditioning for quantum computing devices in accordance with an illustrative embodiment. Configuration 100 comprises a set of one or more dilution fridge stages 102, 104, . . . 106. Input line 108 connects an external circuit to q-circuit 110. Assuming that line 108 carries a microwave signal to q-circuit 110, signal $S_1$ is a signal which includes microwave noise that is to be attenuated along with the signal $S_1$. Signal $S_n$ is the attenuated signal that reaches q-circuit 110.

One embodiment configures a hybrid attenuator with some but not all of stages 102-106. Another embodiment configures a hybrid attenuator with each of stages 102-106, as shown in FIG. 1. For example, hybrid attenuator 112 is configured to operate with stage 102. Hybrid attenuator 112 receives input signal $S_1$ and reflected signal $S_{R2}$ from subsequent stages in the series of stages. Hybrid attenuator 112 attenuates one frequency or frequency band from the $(S_1+SR_2)$ signal to produce signal $S_2$.

Hybrid attenuator 114 is configured to operate with stage 104. Hybrid attenuator 114 receives input signal $S_2$ and reflected signal $S_{R3}$ from subsequent stages in the series of stages. Hybrid attenuator 114 attenuates a different frequency or frequency band from the $(S_2+S_{R3})$ signal to produce signal $S_3$. Operating in this manner, stage 106 (stage n) has hybrid attenuator 116 configured therewith. Hybrid attenuator 116 receives input signal $S_{n-1}$ (and possibly a reflected signal if q-circuit 110 is configured to reflect any signal frequencies, not shown) from previous stages in the series of stages. Hybrid attenuator 116 attenuates a different frequency or frequency band from the $(S_{n-1}+$any reflected frequencies) signal to produce signal $S_n$, which forms an input to q-circuit 110.

Figure 2:
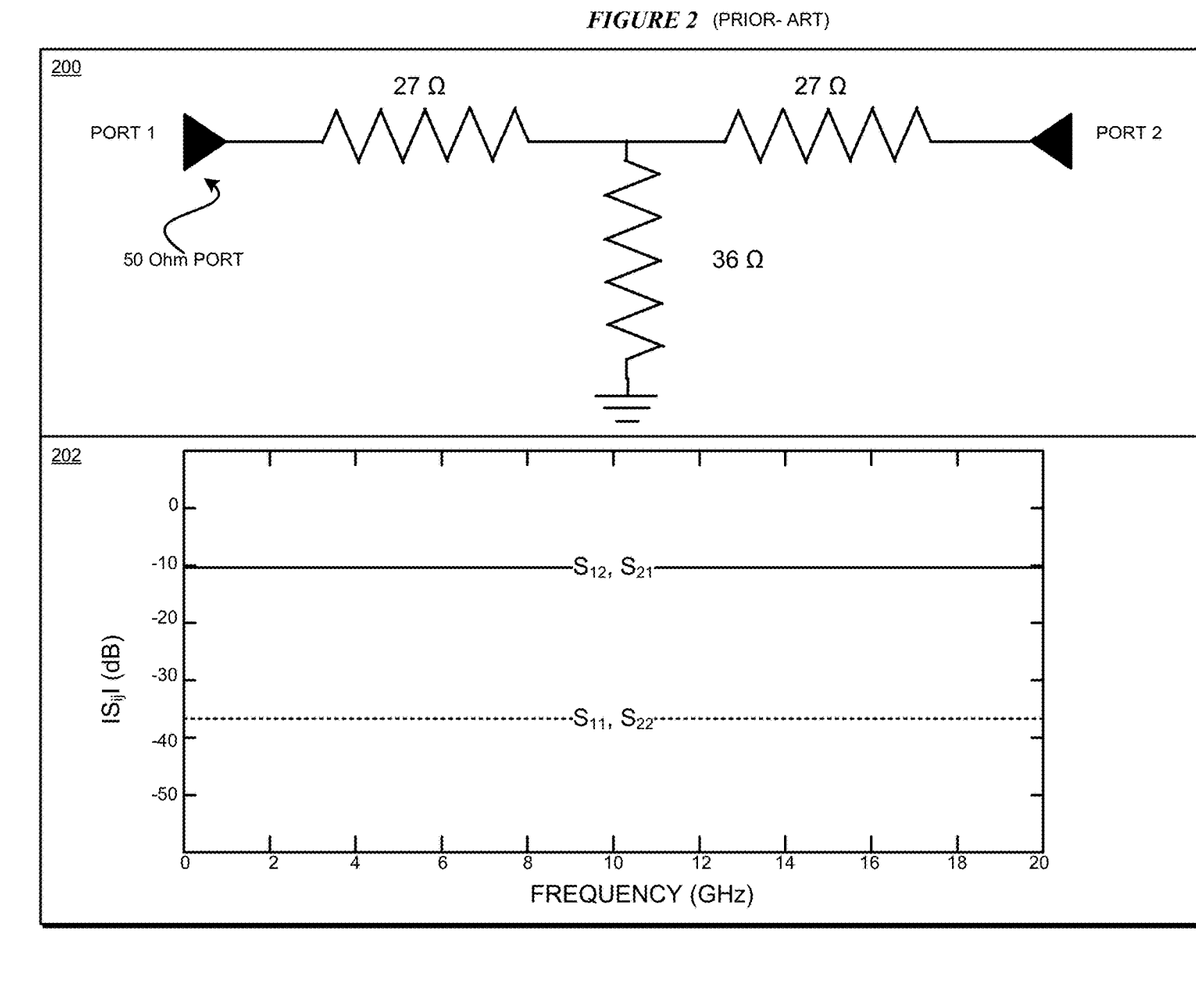
FIG. 2 depicts an example of presently available resistive microwave attenuator which can be used as a component in a hybrid attenuator in accordance with an illustrative embodiment.

With reference to FIG. 2, this figure depicts an example of presently available resistive microwave attenuator which can be used as a component in a hybrid attenuator in accordance with an illustrative embodiment. Circuit 200 implements an example 10-dB lumped-element resistive attenuator that is formed using a T-configuration between ports 1 and 2, (i.e., two equal series resistors connected in the middle by one resistor to ground). In microwave engineering terminology, $S_{12}$ represents the scattering parameter for a signal entering port 2 and exiting through port 1 (i.e., transmission from port 2 to 1). Similarly, $S_{21}$ represents the scattering parameter for a signal entering port 1 and exiting through port 2. $S_{11}$ and $S_{22}$ represent the reflection parameters of signals entering ports 1 and 2, respectively.

Graph 202 depicts microwave simulation results of the scattering parameters of resistive attenuator 200. As can be seen in graph 202, transmitted signals through the device (represented by the amplitude of the scattering parameters $S_{21}$ and $S_{12}$) are attenuated by about 10 dB over a large bandwidth. The device is also well matched to 50 Ohms on both ports as shown by the negligible amplitude of the reflection parameters $S_{11}$ and $S_{22}$. This means that there is almost no reflection off the device ports. The lost energy of the transmitted signals is dissipated as heat within the resistors of the circuit 200.

Figure 3:
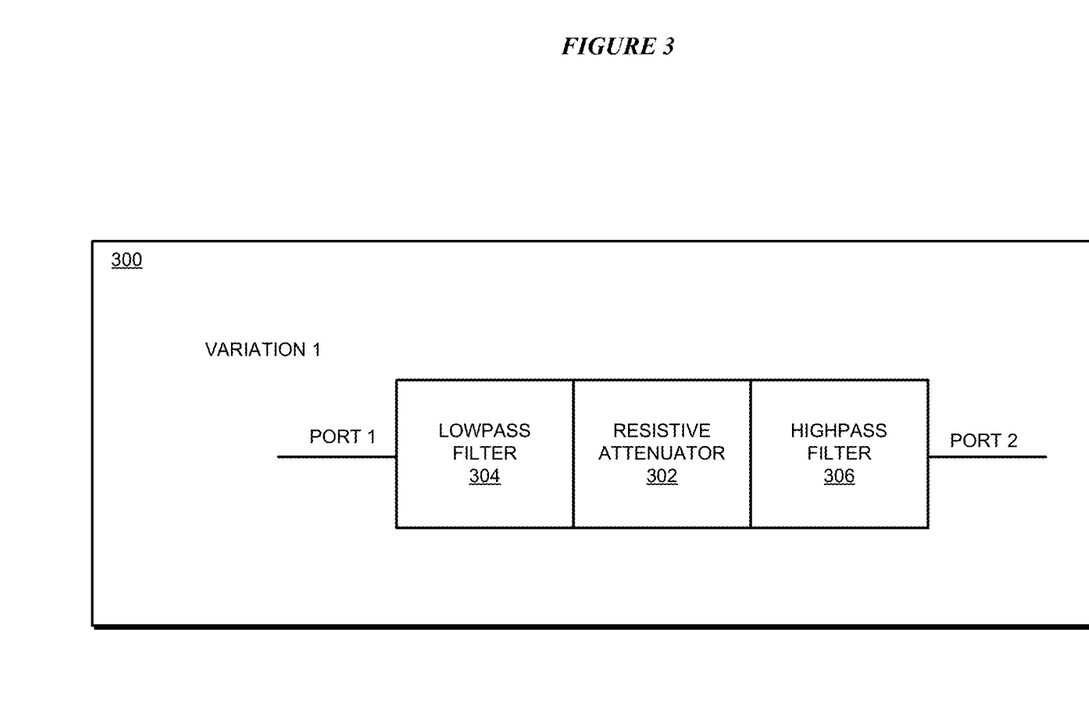
FIG. 3 depicts one example configuration of a hybrid attenuator in accordance with an illustrative embodiment.

With reference to FIG. 3, this figure depicts one example configuration of a hybrid attenuator in accordance with an illustrative embodiment. The example configuration in this figure—variation—of hybrid attenuator 300 comprises resistive attenuator 302, lowpass filter 304, and high-pass filter 306. The components can be arranged in a variety of arrangements within the scope of the illustrative embodiments. For example, one arrangement may be 304-302-306 in that order as shown (i.e., lowpass filter 304, followed by resistive attenuator 302, followed by high-pass filter 306). Other arrangements may be 302-304-306, 304-306-302, 306-302-304, 306-304-302, and others possible arrangements in a similar manner.

Hybrid attenuator 300 is a dispersive-resistive attenuator and can be implemented as a two-port integrated circuit. Lowpass filter 304 is a dispersive filter to filter out a frequency band that is higher than a threshold frequency (and passes a frequency band that is lower than a threshold frequency). Resistive attenuator 302 is resistive or absorptive filter in the manner of resistive attenuator 200 in FIG. 2. High-pass filter 306 is a dispersive filter to filter out a frequency band that is lower than a threshold frequency (and passes a frequency band that is higher than a threshold frequency). According to one embodiment, a circuit assembly system forms and connects the three components—302, 304, and 306 on the same chip or printed circuit board.

Figure 4:
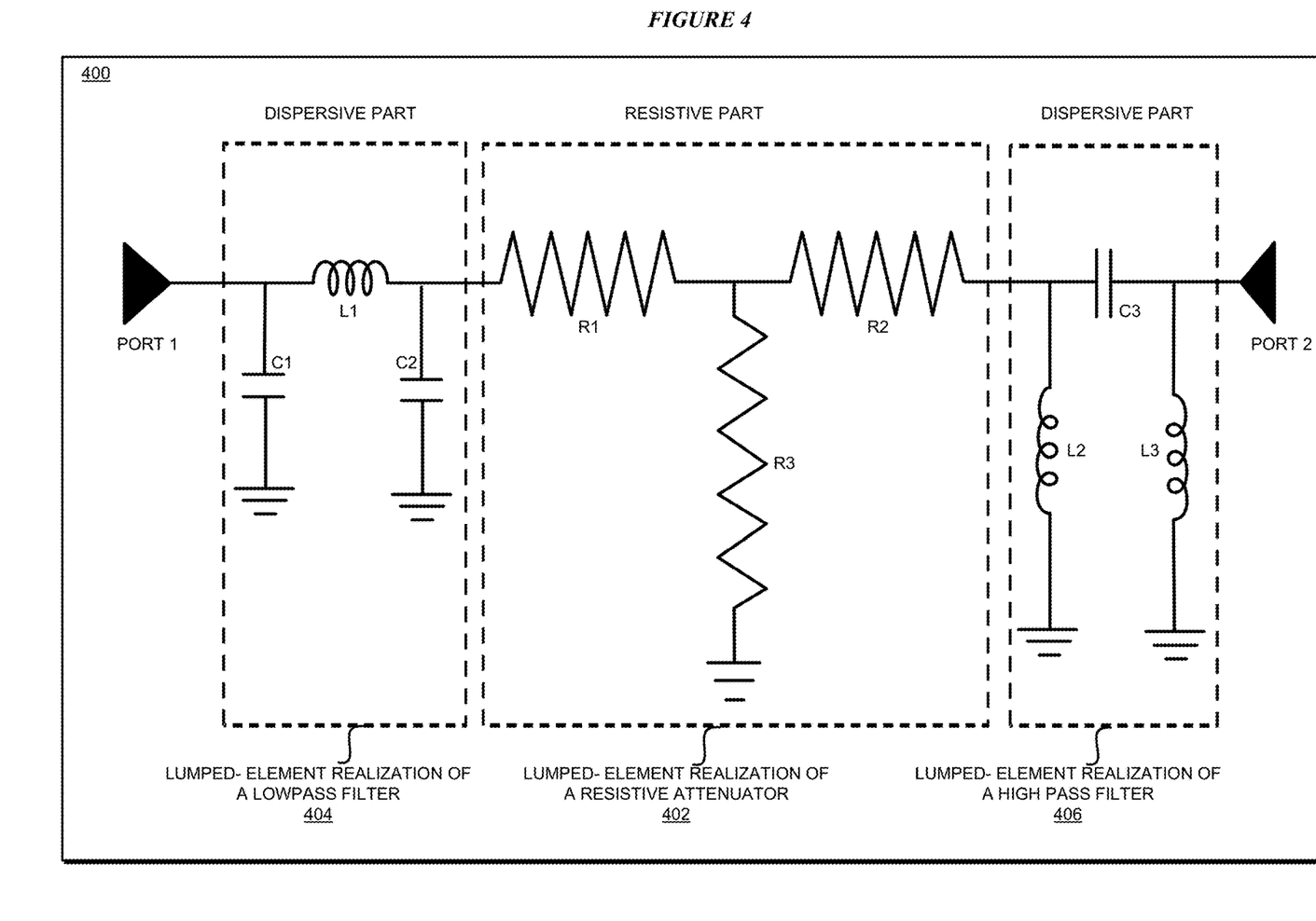
FIG. 4 depicts an example circuit implementing a hybrid attenuator in accordance with an illustrative embodiment.

With reference to FIG. 4, this figure depicts an example circuit implementing a hybrid attenuator in accordance with an illustrative embodiment. Component 402 is a resistive element which implements a resistive attenuator, i.e., component 302 of FIG. 3. Component 404 is a dispersive element which implements a lowpass filter, i.e., component 304 of FIG. 3. Component 406 is a dispersive element which implements a high-pass filter, i.e., component 306 of FIG. 3.

Component 402 comprises a T-configuration of resistor elements R1, R2, and R3, as in FIG. 2. Note that the depiction of component 402 and resistors R1, R2, and R3 are lumped realizations, i.e., a representation of an effective function of component 402 as a resistive attenuator in the microwave frequency band. An equivalent pi-configuration of this component exists and is interchangeable with the depicted non-limiting example configuration.

Component 404 comprises a pi-arrangement of capacitive elements C1 and C2 coupled to ground, i.e., the external conductor of the hybrid attenuator, on one side and to inductive element L1 via the center conductor of the hybrid attenuator on the other side, as shown. The depiction of component 404 and elements C1, C2, and L1 are lumped realizations, i.e., a representation of an effective function of component 404 as a lowpass filter in the microwave frequency band. This example shows a simple one-unit-cell, low-pass filter. This design also covers the cases in which the simple low-pass filter shown in FIG. 4 is replaced by a more sophisticated low-pass filter that consists of several unit cells and whose attenuation, transmission, bandwidth, cutoff frequency and ripples characteristics are optimized further or differently.

Component 406 comprises a pi-arrangement of inductive elements L2 and L3 coupled to ground, i.e., the external conductor of the hybrid attenuator, on one side and to capacitive element C3 via the center conductor of the hybrid attenuator on the other side, as shown. The depiction of component 406 and elements L2, L3, and C3 are lumped realizations, i.e., a representation of an effective function of component 406 as a high-pass filter in the microwave frequency band. This example shows a simple one-unit-cell, high-pass filter. This design also covers the cases in which the simple high-pass filter shown in FIG. 4 is replaced by a more sophisticated high-pass filter that consists of several unit cells and whose attenuation, transmission, bandwidth, cutoff frequency and ripples characteristics are optimized further or differently.

In component 406, capacitive element C3 on the center conductor of the hybrid attenuator serves as a direct current (DC) block which can be used to eliminate the formation of ground loops in the fridge. Such ground loops are undesirable as they can generate electronic noise. Additionally, inductive elements L2 and L3 offer a path of negligible resistance between the center conductor and the external conductor of the hybrid attenuator. Such low-resistance, electrical-thermal paths can significantly improve the thermalization of the center conductor of the hybrid attenuator compared to the case of the resistive attenuator alone, where the center conductor is thermally isolated from ground (the attenuator housing) by a considerable electrical-thermal resistance.

To facilitate low microwave noise, high thermalization, or both, various embodiments effectuate the fabrication of hybrid attenuator 400 in a variety of ways using lumped elements as shown and described herein. One embodiment fabricates components 402, 404, and 406 on a single chip using semiconductor fabrication methods on a substrate of a wafer. Another embodiment fabricates components 402, 404, and 406 using circuit assembly methods on a printed circuit board (PCB) to integrate electrical and electronic elements to form components 402, 404, and 406 on the same PCB.

To form the lumped element realization of components 402, 404, and 406, one embodiment fabricates an inductor, e.g., inductive elements L1, L2, and/or L3 using a metal that exhibits a Residual Resistance Ratio (RRR) of at least 100, and a thermal conductivity of greater than a 1 W/(cm*K) at 4 Kelvin, threshold level of thermal conductivity. RRR is the ratio of the resistivity of a material at room temperature and at 0 K. Because 0 K cannot be reached in practice, an approximation at 4 K is used. Furthermore, because different stages operate in different temperature ranges, the material selection for the inductive elements also differs from one lumped realization to another, depending on the stage—and thermal range—in which the lumped realization will be operating. Some non-limiting examples of metals usable for the inductive elements include Aluminum and Brass for operations in the temperature range of 300K to 2 K. Some non-limiting examples of metals usable for the inductive elements include oxygen-free high-conductivity copper, electrolytic copper, gold, platinum, or silver for operations in the temperature range of 2K to 0.000001K.

To form the lumped element realization of components 402, 404, and 406, one embodiment fabricates a capacitor, e.g., capacitive elements C1, C2, and/or C3 using a dielectric material that exhibits an RRR of at least 100, and plates having a thermal conductivity of greater than a 1 W/(cm*K) at 4 Kelvin threshold level of thermal conductivity. Some non-limiting examples of materials usable for the dielectric of the capacitive elements include Silicon Nitride (SiN), Crystalline Silicon, and amorphous Silicon.

To form the lumped element realization of components 402, 404, and 406, one embodiment fabricates a resistor, e.g., resistive elements R1, R2, and/or R3 using a thin film of resistive metals. In one embodiment, the thickness of the thin film is below a threshold thickness, e.g., 100 nm, and some non-limiting examples of metals usable to form the thin-film resistive elements include NiCr, TaN$_x$ (nickel-chrome, talinum-nitrate).

To fabricate hybrid attenuator 400 in one or the above-described manner, an embodiment uses a substrate material that exhibits high thermal conductivity at low temperatures. In one embodiment, the thermal conductivity of substrate is at least equal to or greater than a threshold level of thermal conductivity, e.g., 0.1 W/(cm*K) at 4 Kelvin, in a temperature range, e.g. 4-300 K. some non-limiting examples of materials usable to form the substrate include Silicon, Gallium Arsenide (GaAs), sapphire, quartz, and fused silica.

The lumped realizations of components 402, 404, and 406 are not intended to be limiting. From this disclosure, those of ordinary skill in the art will be able to conceive many other implementations for a depicted lumped realization, e.g., using additional or different elements to achieve a similar function of the lumped realization shown here, and such implementations are contemplated within the scope of the illustrative embodiments.

Figure 5:
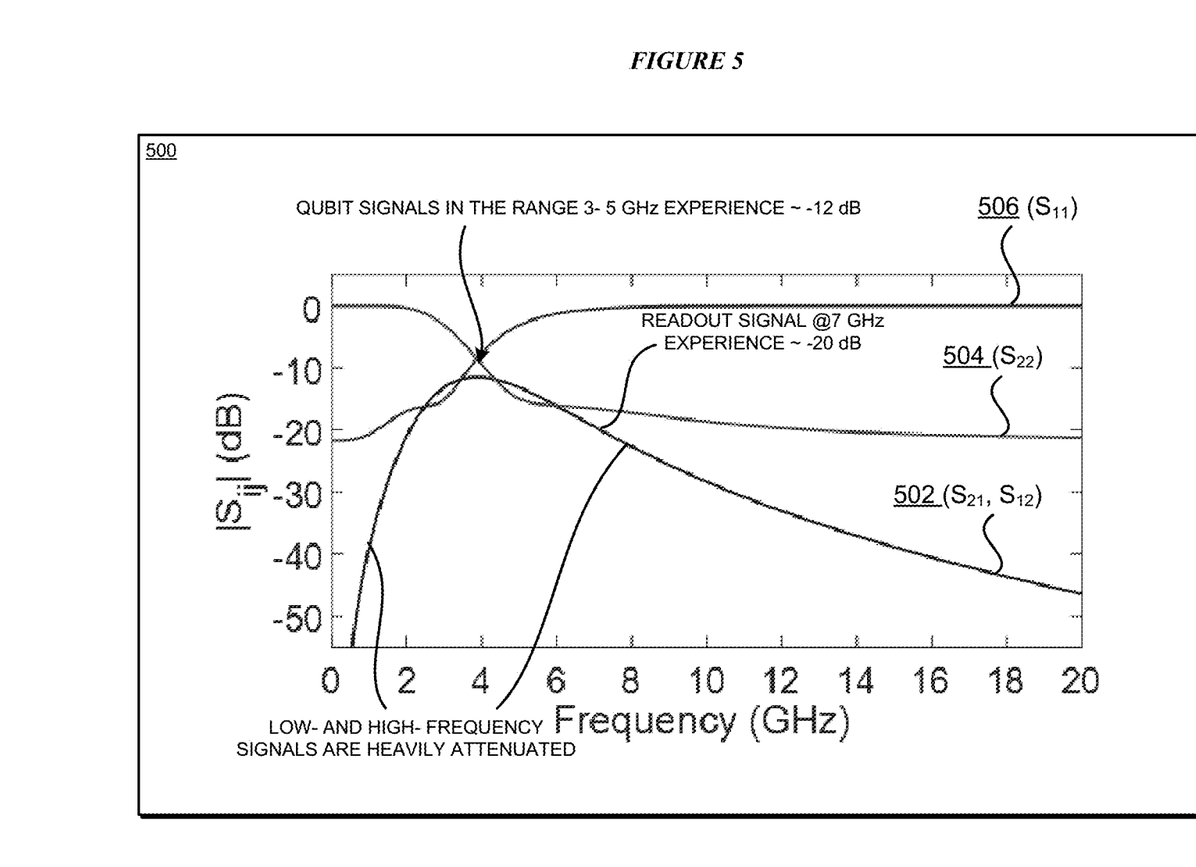
FIG. 5 depicts microwave simulation results of the scattering parameters of a hybrid attenuator example.

With reference to FIG. 5, this figure depicts microwave simulation results of the scattering parameters of a hybrid attenuator example. The hybrid attenuator circuit, whose scattering parameters are shown in FIG. 5, is based on the lumped-element circuit 400 exhibited in FIG. 4. Specifically, in the non-limiting example implementation, R1 and R2 were each set to 27 Ohms, R3 was set to 36 Ohms, L1 was set to 3.18 nanohenry (nH), C1 and C2 were each set to 0.64 picofarad (pF), L2 and L3 were each set to 2.65 nH, and C3 was set to 0.53 pF.

In FIG. 5, the graph 502 represents the transmission parameters $S_{21}$ and $S_{12}$, while the graphs 506 and 504 represent the reflection parameter $S_{11}$ and $S_{22}$, respectively. Graph 502 shows significant attenuation for transmitted signals above (e.g., 20 dB at 7 GHz) and below (e.g., 20 dB around 2 GHz) the superconducting qubit frequency range (e.g., 3-5 GHz), while allowing the signals in the qubit signal range to pass moderately attenuated (i.e., attenuated by about 10 dB).

Figure 6:
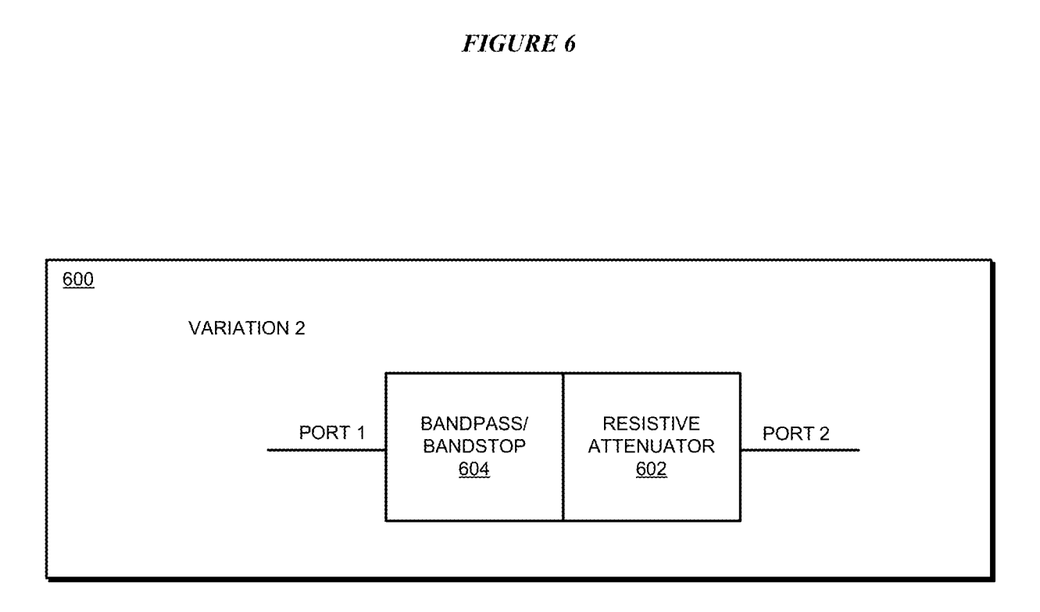
FIG. 6 depicts another example configuration of a hybrid attenuator in accordance with an illustrative embodiment.

With reference to FIG. 6, this figure depicts another example configuration of a hybrid attenuator in accordance with an illustrative embodiment. The example configuration in this figure—variation 2—of hybrid attenuator 600 comprises resistive attenuator 602 and bandpass (or bandstop) filter 604. The components can be arranged in a variety of arrangements within the scope of the illustrative embodiments. For example, one arrangement may be 604-602 in that order as shown (i.e., bandpass filter 604, followed by resistive attenuator 602). Other arrangements may be 602-604, 604-602-604 for different frequency bands, and others possible arrangements in a similar manner.

Hybrid attenuator 600 is a dispersive-resistive attenuator and can be implemented as a two-port integrated circuit. Bandpass filter 604 is a dispersive filter to allow a frequency band that is between two threshold frequencies (and attenuates/blocks frequencies outside this pass band). Resistive attenuator 602 is resistive or absorptive filter that operates in the manner of resistive attenuator 302 in FIG. 3. According to one embodiment, a circuit assembly system forms and connects together the two components—602 and 604 on the same chip or printed circuit board.

Figure 7:
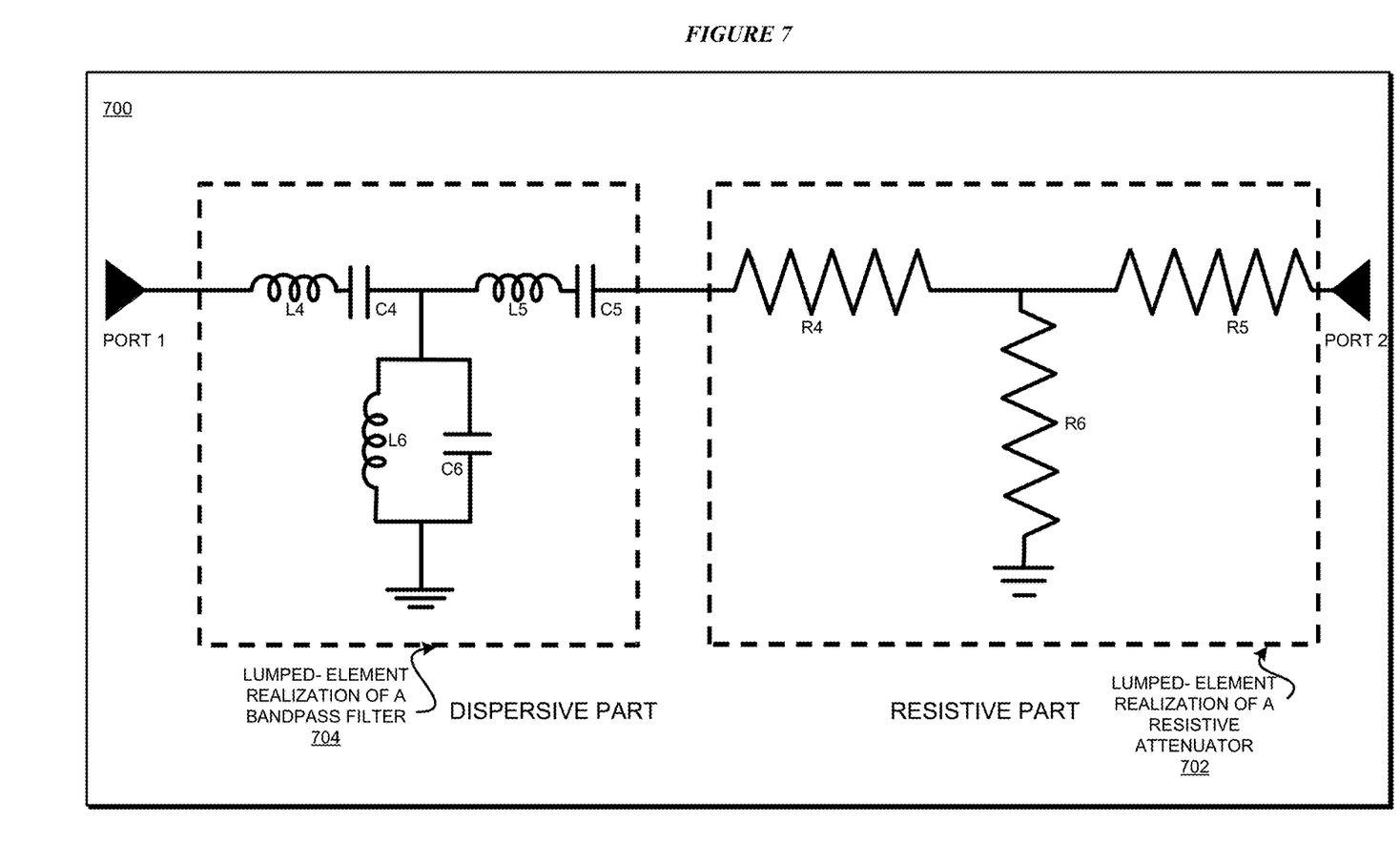
FIG. 7 depicts an example circuit implementing a hybrid attenuator in accordance with an illustrative embodiment.

With reference to FIG. 7, this figure depicts an example circuit implementing a hybrid attenuator in accordance with an illustrative embodiment. Component 702 is a resistive element which implements a resistive attenuator in a manner similar to component 302 of FIG. 3. Component 704 is a dispersive element which implements a bandpass filter which replaces components 304 and 306 of FIG. 3 and plays a similar role.

Component 702 comprises a T-configuration of resistor elements R4, R5, and R6, as in FIG. 2. Note that the depiction of component 702 and resistors R4, R5, and R6 are lumped realizations, i.e., a representation of an effective function of component 702 as a resistive attenuator in the microwave frequency band.

Component 704 comprises a configuration of capacitive elements L6 and C6 in parallel and coupled to ground, i.e., the external conductor of the hybrid attenuator on one side. L6-C6 couple to L4-C4 series and L5-C5 series via an internal conductor of the hybrid attenuator on the other side, as shown. The depiction of component 704 and elements L4-L6 and C4-C6 are lumped realizations, i.e., a representation of an effective function of component 704 as a bandpass filter in the microwave frequency band. This example shows a simple one-unit-cell, bandpass filter. This design also covers the cases in which the simple bandpass filter shown in FIG. 7 is replaced by a more sophisticated bandpass filter that consists of several unit cells and whose attenuation, transmission, bandwidth, cutoff frequency and ripples characteristics are optimized further or differently.

In component 704, capacitive elements C4 and C5 on the internal conductor of the hybrid attenuator serve as DC blocks, which can be used to eliminate the formation of ground loops in the fridge. Such ground loops are undesirable as they can generate electronic noise. Inductive element L6 connecting the center and external conductors of the hybrid attenuator offers a path of negligible resistance between the center conductor and the external conductor of the hybrid attenuator. Such low-resistance, electrical-thermal paths can significantly improve the thermalization of the center conductor of the hybrid attenuator compared to the case of the resistive attenuator alone, where the center conductor is thermally isolated from ground (the attenuator case) by a considerable electrical-thermal resistance.

To facilitate low microwave noise, high thermalization, or both, various embodiments effectuate the fabrication of hybrid attenuator 700 in a manner similar to the embodiments described with respect to hybrid attenuator 400 in FIG. 4. One embodiment fabricates components 702 and 704 on a single chip using semiconductor fabrication methods on a substrate of a wafer. Another embodiment fabricates components 702 and 704 using circuit assembly methods on a printed circuit board (PCB) to integrate electrical and electronic elements to form components 702 and 704 on the same PCB.

To form the lumped element realization of components 702 and 704, one embodiment fabricates an inductor, e.g., inductive elements L4, L5, and/or L6 using materials and techniques described with respect to inductive elements L1, L2, or L3 in FIG. 4. Similarly, an embodiment fabricates a capacitor, e.g., capacitive elements C4, C5, and/or C6 using materials and techniques described with respect to capacitive elements C1, C2, or C3 in FIG. 4. An embodiment fabricates a resistor, e.g., resistive elements R4, R5, and/or R6 using materials and techniques described with respect to resistive elements R1, R2, or R3 in FIG. 4. When a substrate is used for fabricating lumped realizations 702 and 704, an embodiment uses a material for the substrate as described with respect to FIG. 4.

The lumped realizations of components 702 and 704 406 are not intended to be limiting. From this disclosure, those of ordinary skill in the art will be able to conceive many other implementations for a depicted lumped realization, e.g., using additional or different elements to achieve a similar function of the lumped realization shown here, and such implementations are contemplated within the scope of the illustrative embodiments.

Figure 8:
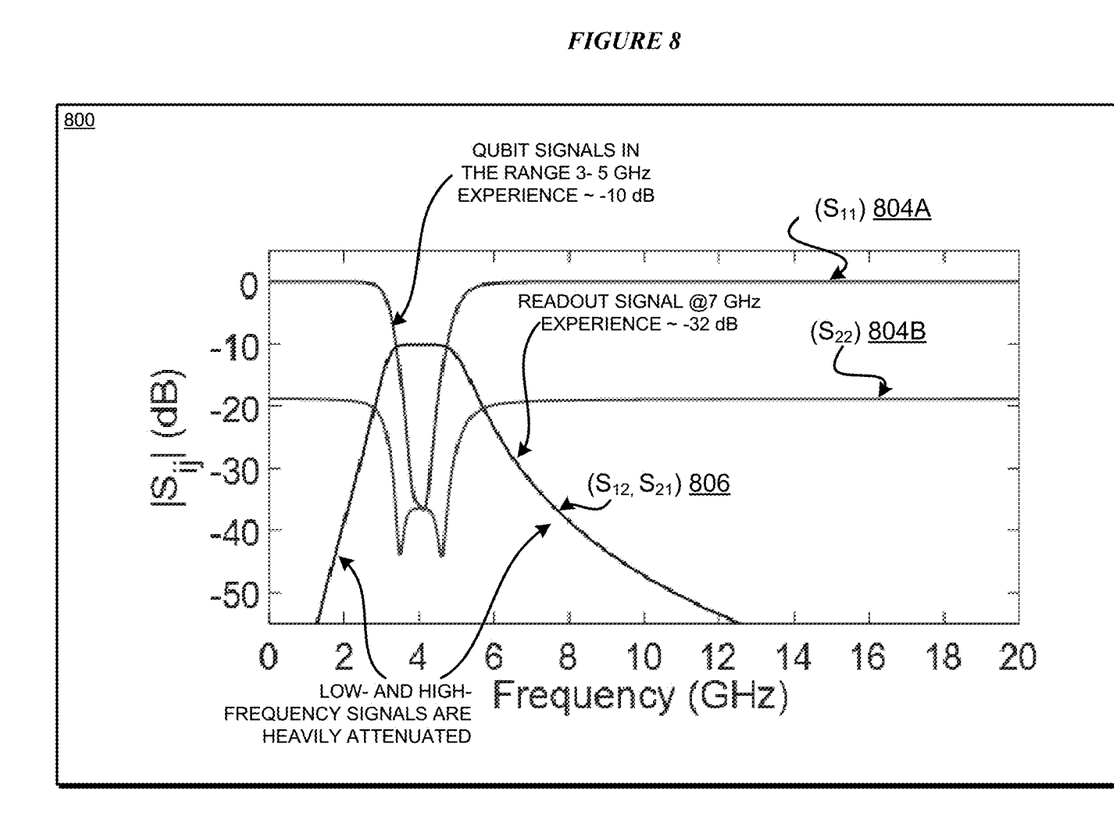
FIG. 8 depicts microwave simulation results of the scattering parameters of a hybrid attenuator example.

With reference to FIG. 8, this figure depicts microwave simulation results of the scattering parameters of a hybrid attenuator example. The hybrid attenuator circuit, whose scattering parameters are shown in FIG. 8, is based on the lumped-element circuit 700 exhibited in FIG. 7. Specifically, in the non-limiting example implementation, R4 and R5 were each set to 27 Ohms, R6 was set to 36 Ohms, L4 and L5 were each set to 3.98 nH, C4 and C5 were each set to 0.398 pF, L6 was set to 0.497 nH, and C6 was set to 3.18 pF.

Graphs 804A and 804B represent the reflection parameter $S_{11}$ and $S_{22}$, respectively, for the example hybrid attenuator configuration shown in FIG. 7. Graph 804A exhibits significant reflection outside the frequency range of qubit signals, which is approximately 3 to 5 GHz. Whereas, graph 804B exhibits good matching to 50 Ohm (i.e., the characteristic impedance of the external ports of the hybrid attenuator) in the qubit frequency range.

Graph 806 represents the transmission parameters $S_{21}$ and $S_{12}$ for the example hybrid attenuator shown in FIG. 7. Graph 806 shows significant attenuation above and below the qubit frequency range. Component 702 with the bandpass filter 704 configuration produced a low level attenuation of approximately −10 to −12 decibels (dB) in the range of qubit signals, which is approximately 3 to 5 GHz in input signals, thus passing the qubit signals with relatively small attenuation while suppressing noise and signals outside the qubit range. Such a moderate attenuation of qubit signals might be useful when the duration of the quantum gates decreases with higher powers for qubit pulses (e.g., cross-resonance gates).

Figure 9:
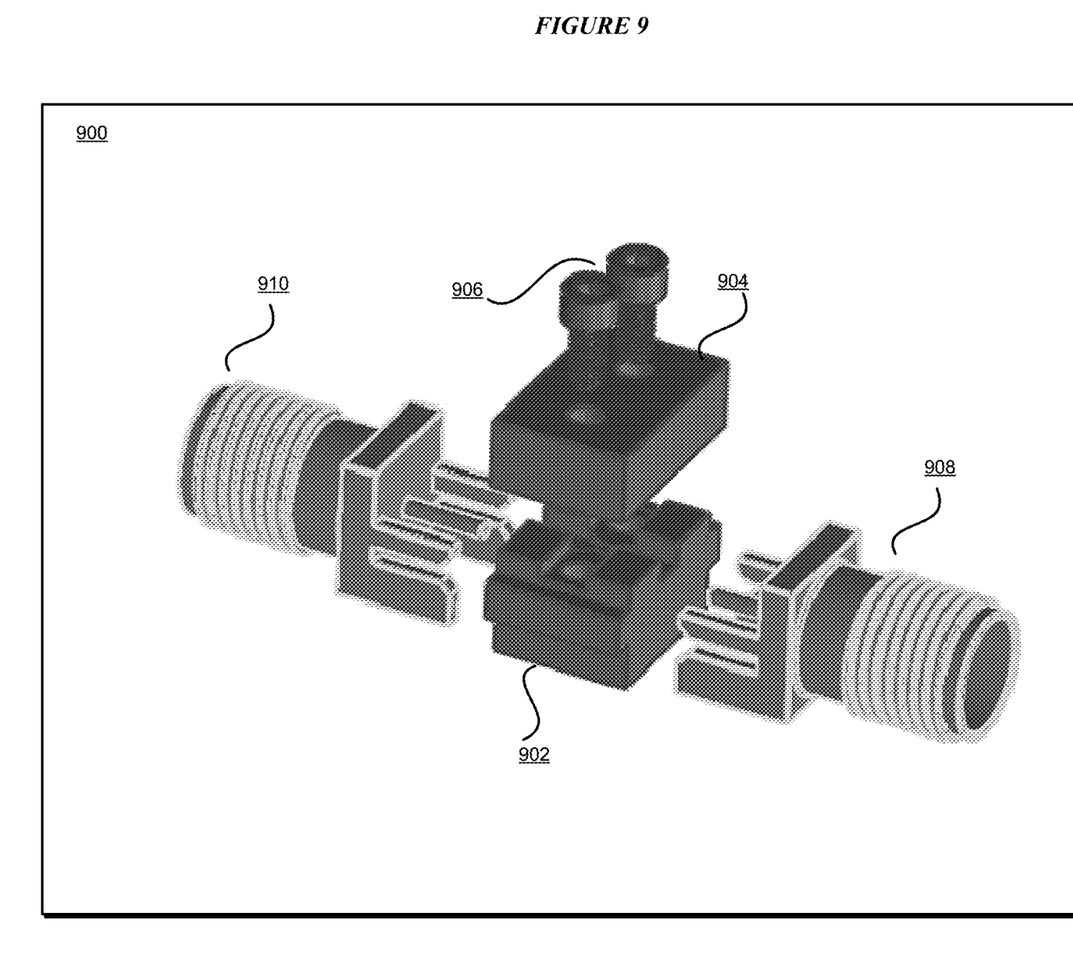
FIG. 9 depicts a rendering of an example packaging or housing for a hybrid attenuator in accordance with an illustrative embodiment.

With reference to FIG. 9, this figure depicts a rendering of an example packaging or housing for a hybrid attenuator in accordance with an illustrative embodiment. Housing 900 is a non-limiting example configuration of a housing for a cryogenic resistive-dispersive hybrid attenuator. Housing 900 exhibits high thermalization with an associated stage, minimizes the generation and introduction of microwave reflections in the line connecting through the hybrid attenuator housed within (not visible), and is usable in one or more temperature range at which quantum processing circuits or portions thereof operate. Housing 900 is formed from a high-thermal conductivity material e.g., a material that exhibits thermal conductivity which meets or exceeds a threshold thermal conductivity level of 1 Watt/Kelvin-centimeter.

Housing 900 comprises base 902 which includes the space in which the hybrid attenuator can be fabricated, situated, or otherwise installed. Housing 900 further comprises cover 904. Cover 904 is configured to fully cover an opening (not shown) in base 902, where the opening is usable for installing the attenuator into base 902. Cover 904 is thermally fastened, clamped, or otherwise thermally coupled with base 902 in such a manner that base 902 and cover 904 are well thermalized to one another, i.e., the combination of base 902 and cover 904 is thermally at the same temperature when coupled together.

One non-limiting example manner of fastening cover 904 to base 902 for acceptable thermalization in quantum computing temperature range is depicted in FIG. 9. One or more screws 906 fabricated from a material that exhibits thermal conductivity above a threshold level of thermal conductivity thermally contact cover 904 as well as base 902 to thermalize cover 904 to base 902. Brass is one non-limiting example of material usable for fabricating screws 906. This example of fastening for thermalization is not intended to be limiting. From this disclosure, those of ordinary skill in the art will be able to conceive many other methods of fastening for good thermalization and the same are contemplated within the scope of the illustrative embodiments. For example, in place of screws 906, cover 904 can be bonded to base 902 using a thermally conductive bonding agent that exhibits thermal conductivity above the threshold level of thermal conductivity.

Housing 900 further comprises connectors 908 and 910. Connectors 908 and 910 are specifically configured for usability with signals in the microwave frequency range. In accordance with an illustrative embodiment, connectors 908 and 910 are selected to be of the same type and gender. For example, connectors 908 and 910 can both be SubMiniature version A (SMA) type connectors of the female type such that connecting a microwave cable to housing 900 (and thereby to the hybrid attenuator 400 or 700 within housing 900) does not require a gender conversion adapter. Using the same type and gender of connectors 908 and 910 thus minimizes microwave signal reflection that would otherwise arise from gender conversion adapters.

Furthermore, a material or a combination of materials used for connectors 908 and 910 should exhibit high thermal conductivity (above a threshold) as well as high electrical conductivity (above a threshold electrical conductivity or below a threshold resistance). One such non-limiting combination of materials is brass with gold plating to form connectors 908 and 910. In one non-limiting embodiment, the threshold electrical conductivity is comparable to the electrical conductivity of copper or copper alloy used in manufactured electrical wiring, measured at room temperature.

These examples of the types, genders, and material-combinations of connectors 908 and 910 are not intended to be limiting. From this disclosure, those of ordinary skill in the art will be able to conceive many other types, genders, and material-combinations of microwave connectors and the same are contemplated within the scope of the illustrative embodiments. For example, miniature coaxial (MCX) or micro-miniature coaxial (MMCX) connectors, or many other types of microwave and radio frequency connectors, of the same gender, and of a suitable material or material combination, can be formed and used as connectors 908 and 910 within the scope of the illustrative embodiments.

Furthermore, connectors 908 and 910 may be fastened to microwave cables using any suitable manner of fastening. The depicted non-limiting example shows screw-type threaded connectors 908 and 910 to which a corresponding male end of a microwave cable can be threaded on. Without departing the scope of the illustrative embodiments, a press-fit or friction coupling type connectors can be used as connectors 908 and 910 so long as such connectors are of the same gender and are formed to satisfy the thermal conductivity and electrical conductivity requirements described herein.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A hybrid microwave attenuator comprising:
  a circuit having a first port and a second port, the circuit comprising:
    a resistive component configured to attenuate a plurality of frequencies in an input signal (transmitted signal); and
    a dispersive component configured to attenuate a second plurality of frequencies within a frequency range,
    wherein the resistive component and the dispersive component are arranged in a series configuration relative to one another between the first port and the second port of the circuit;
  a housing, the housing comprising:
    a closable structure in which the circuit is positioned, the structure being formed of a first material that exhibits at least a first threshold level of thermal conductivity,
    wherein the first threshold level of thermal conductivity is achieved at a cryogenic temperature range in which a quantum computing circuit operates; and
    a pair of microwave connectors, the pair of connectors thermally coupled to the housing,
  wherein the dispersive component comprises:
    a first inductive element;
    a first capacitive element electrically connected in series with the first inductive element, the first capacitive element and the first inductive element being between the first port and the resistive component;
    a second inductive element electrically connected between the resistive component and the housing; and
    a second capacitive element electrically connected in parallel with the second inductive element,
  wherein the second inductive element provides an electrical-thermal path between the resistive component and the housing,
  wherein the second inductive element comprises a second material that exhibits at least a second threshold level of thermal conductivity achieved at the cryogenic temperature range.

2. The hybrid microwave attenuator of claim 1, wherein the hybrid microwave attenuator is configured to operate in a temperature range of a refrigeration stage, and
  wherein the second capacitive element comprises:
    a dielectric material; and
    a pair of plates that exhibits at least a third threshold level of thermal conductivity when operating in the temperature range.

3. The hybrid microwave attenuator of claim 1, wherein the hybrid microwave attenuator is configured to operate in a temperature range of a refrigeration stage, wherein the dispersive component further comprises:
  a substrate formed of a third material that exhibits at least a third threshold level of thermal conductivity when operating in the temperature range.

4. The hybrid microwave attenuator of claim 1, wherein each connector in the pair of connectors is of an identical gender.

5. The hybrid microwave attenuator of claim 1, wherein a first connector in the pair of connectors is coupled to the first port and a second connector in the pair of connectors is coupled to the second port.

6. The hybrid microwave attenuator of claim 1, wherein the hybrid microwave attenuator is configured to operate in a temperature range of a refrigeration stage, and wherein the pair of connectors are formed of a third material that exhibits at least a third threshold level of thermal conductivity of greater than a threshold thermal conductivity when operating in the temperature range.

7. The hybrid microwave attenuator of claim 1, wherein the hybrid microwave attenuator is configured to operate in a temperature range of a refrigeration stage.

8. The hybrid microwave attenuator of claim 7, wherein the temperature range is bound by 300 degrees Kelvin (K) and 2 K.

9. The hybrid microwave attenuator of claim 7, wherein the temperature range is bound by 2 K and 0.000001 K.

10. A fabrication system performing operations comprising:
   forming a hybrid microwave attenuator by assembling a circuit having a first port and a second port, the circuit comprising:
      a resistive component configured to attenuate a plurality of frequencies in an input signal (transmitted signal); and
      a dispersive component configured to attenuate a second plurality of frequencies within a frequency range,
      wherein the resistive component and the dispersive component are arranged in a series configuration relative to one another between the first port and the second port of the circuit;
   forming a housing, the housing comprising:
      a closable structure in which the circuit is positioned, the structure being formed of a first material that exhibits at least a first threshold level of thermal conductivity,
      wherein the first threshold level of thermal conductivity is achieved at a cryogenic temperature range in which a quantum computing circuit operates; and
      a pair of microwave connectors, the pair of connectors thermally coupled to the housing,
   wherein the dispersive component comprises:
      a first inductive element;
      a first capacitive element electrically connected in series with the first inductive element, the first capacitive element and the first inductive element being between the first port and the resistive component;
      a second inductive element electrically connected between the resistive component and the housing; and
      a second capacitive element electrically connected in parallel with the second inductive element,
   wherein the second inductive element provides an electrical-thermal path between the resistive component and the housing,
   wherein the second inductive element comprises a second material that exhibits at least a second threshold level of thermal conductivity achieved at the cryogenic temperature range.

11. A method comprising:
   forming a hybrid microwave attenuator by assembling a circuit having a first port and a second port, the circuit comprising:
      a resistive component configured to attenuate a plurality of frequencies in an input signal (transmitted signal); and
      a dispersive component configured to attenuate a second plurality of frequencies within a frequency range,
      wherein the resistive component and the dispersive component are arranged in a series configuration relative to one another between the first port and the second port of the circuit;
   forming a housing, the housing comprising:
      a closable structure in which the circuit is positioned, the structure being formed of a first material that exhibits at least a first threshold level of thermal conductivity,
      wherein the first threshold level of thermal conductivity is achieved at a cryogenic temperature range in which a quantum computing circuit operates; and
      a pair of microwave connectors, the pair of connectors thermally coupled to the housing,
   wherein the dispersive component comprises:
      a first inductive element;
      a first capacitive element electrically connected in series with the first inductive element, the first capacitive element and the first inductive element being between the first port and the resistive component;
      a second inductive element electrically connected between the resistive component and the housing; and
      a second capacitive element electrically connected in parallel with the second inductive element,
   wherein the second inductive element provides an electrical-thermal path between the resistive component and the housing,
   wherein the second inductive element comprises a second material that exhibits at least a second threshold level of thermal conductivity achieved at the cryogenic temperature range.

12. The method of claim 11, wherein the hybrid microwave attenuator is configured to operate in a temperature range of a refrigeration stage, and
   wherein the second capacitive element comprises:
      a dielectric material; and
      a pair of plates that exhibits at least a third threshold level of thermal conductivity when operating in the temperature range.

13. The method of claim 11, wherein the hybrid microwave attenuator is configured to operate in a temperature range of a refrigeration stage, wherein the dispersive component further comprises:
   a substrate formed of a third material that exhibits at least a third threshold level of thermal conductivity when operating in the temperature range.

14. The method of claim 11, wherein each connector in the pair of connectors is of an identical gender.

15. The method of claim 11, wherein a first connector in the pair of connectors is coupled to the first port and a second connector in the pair of connectors is coupled to the second port.

16. The method of claim 11, wherein the hybrid microwave attenuator is configured to operate in a temperature range of a refrigeration stage, and wherein the pair of connectors are formed of a third material that exhibits at least a third threshold level of thermal conductivity of greater than a threshold thermal conductivity when operating in the temperature range.

17. The method of claim 11, wherein the hybrid microwave attenuator is configured to operate in a temperature range of a refrigeration stage.

18. The method of claim 17, wherein the temperature range is bound by 300 degrees Kelvin (K) and 2 K.

19. The method of claim 17, wherein the temperature range is bound by 2 K and 0.000001 K.

\* \* \* \* \*